United States Patent [19]

Chittipeddi et al.

[11] Patent Number: 5,147,820
[45] Date of Patent: Sep. 15, 1992

[54] SILICIDE FORMATION ON POLYSILICON

[75] Inventors: Sailesh Chittipeddi, Whitehall; Pradip K. Roy; Ankineedu Velaga, both of Allentown, all of Pa.

[73] Assignee: AT&T Bell Laboratories, Murray Hill, N.J.

[21] Appl. No.: 749,762

[22] Filed: Aug. 26, 1991

[51] Int. Cl.$^5$ ............................................ H01L 21/283
[52] U.S. Cl. ..................................... 437/193; 437/41; 437/200; 437/112
[58] Field of Search ............... 437/200, 191, 193, 192, 437/195, 40, 41, 108, 109, 112; 357/67 S

[56] References Cited

U.S. PATENT DOCUMENTS 4,378,628  4/1983  Levinstein et al. ................. 437/202
4,631,804  12/1986  Roy ..................................... 29/576
4,742,020  5/1988  Roy ..................................... 437/61

FOREIGN PATENT DOCUMENTS 62-115776  5/1987  Japan .

OTHER PUBLICATIONS

Wolf, S., et al., Silicon Processing for the VLSI Era Volume I-Process Technology, Lattice Press, 1986, pp. 386-399, 175-180.

*Primary Examiner*—T. N. Quach
*Attorney, Agent, or Firm*—James H. Fox

[57] ABSTRACT

An integrated circuit includes a doped polysilicon/silicide ("polycide") gate electrode. The doped polysilicon layer comprises sub-layers. The sub-layers are formed by varying the silicon deposition conditions, typically including the deposition rate, while decreasing the dopant concentration. The metal silicide layer is then formed on top of the doped polysilicon layer. An improvement in uniformity and planarity of the structure is obtained as a result of stress accommodation. In addition, the sub-layers reduce the channeling effect that occurs during high energy source/drain dopant implantation. These effects allow for a reduced stack height of the gate electrode, resulting in improvements in very small (sub-micron) device structures.

15 Claims, 2 Drawing Sheets

TIME (NUMBER OF CYCLES OF SUB-LAYERING)
SCHEMATIC insitu DOPED LAYERED POLYSi DEPOSITION PROCESS

NUMBER OF SUB-LAYERING HALF-CYCLES

TIME (NUMBER OF CYCLES OF SUB-LAYERING)
SCHEMATIC insitu DOPED LAYERED POLYSi DEPOSITION PROCESS

SILICIDE FORMATION ON POLYSILICON

BACKGROUND OF THE INVENTION

1. Field of the Invention

The present invention relates to a technique for making a semiconductor device that includes the formation of a silicide layer on a deposited silicon layer.

2. Description of the Prior Art

In the production of integrated circuits (ICs), it has become common practice to form silicide conductor layers. The silicides are compounds comprising a refractory metal and silicon, which may be in the form of deposited polysilicon. The refractory metals commonly used or proposed include titanium, tantalum, tungsten, molybdenum, and cobalt, among others. Such metal silicide layers have relatively high conductivity, and when lithographically patterned, can serve as gate electrodes for field effect transistors, and conductor patterns, referred to as "runners", for interconnecting various circuit elements of the integrated circuit.

For example, referring to FIG. 1, a typical MOS structure comprises a p-type silicon substrate 101. (In the case of a CMOS IC, region 101 could be a p-tub). A n-channel transistor is formed in the substrate, and includes source/drain n+doped regions 103 and 104, having silicide layers 106 and 107 formed thereon, respectively. The gate electrode comprises a doped polysilicon layer 109 and silicide layer 108 overlying a gate oxide 110. The gate sidewalls may be covered by spacers 129 and 130, as in the case of the "lightly doped drain" (LDD) structure. Furthermore, the same conductive layers that form the gate electrode may extend over the field oxide region 120, forming a runner comprising doped polysilicon layer 123 and silicide layer 122. The combination of the doped polysilicon and silicide layers is frequently referred to as the "polycide" structure in the art. Various other applications for silicide layers are known for bipolar and optical devices.

As the lateral dimensions of integrated circuit elements becomes smaller, it is also necessary to reduce the height of various circuit structures. For example, the height of a polycide gate electrode includes the thickness of the deposited polysilicon layer (109) and the silicide layer (108) formed thereon. As lateral dimensions (e.g., gate length) shrink below 1 micrometer, it is typically necessary to reduce the so-called "stack height" (d1) of the polycide structure to less than 1 micrometer, and desirably less than 0.5 micrometers. This is necessary in order to reduce problems relating to etching of relatively thick layers, as well as for preventing excessive step heights that interfere with the formation of overlying circuit elements. However, as the stack height of the gate electrode decreases, the probability increases that shorts will occur between the gate electrode and the adjacent source/drain electrodes during silicide formation. Furthermore, significant problems at the interface between the polysilicon layer and the silicide layer have been observed. These problems have included direct shorts and de- lamination of the silicide layer in some cases. In addition, at small stack heights, the planarity of the gate is reduced, and the surface actually becomes concave, rather than being the ideal planar surface shown for layer 108.

Generally, the deposited polysilicon films have a high degree of [110] preferred crystallographic orientation, and a large variation in stress within the polysilicon layer. In addition, these polysilicon films, when used as a mask for a gate oxide, are more susceptible to ion-channelling in <110> directions during a high energy source/drain ion implant operation. This problem is especially significant for ion implant energies in excess of about 70 keV. It is known that the channeling can be minimized by randomizing the polysilicon orientation. It is also known that most silicide structures exhibit the "snow plow effect" during their formation, where the redistribution of n-type dopant concentration often occurs.

One important criterion of proper circuit operation is the resistance of the conductors used to form runners. Therefore, as both the lateral dimensions and stack height are reduced, the cross-sectional area of the polycide conductors is reduced. This leads to increased electrical resistance of the conductors, which is undesirable in most cases. Therefore, any solution to the problems relating to thin stack heights should not unduly increase the electrical resistance of the polycide conductors.

SUMMARY OF THE INVENTION

We have invented an improved technique of making a semiconductor device that includes a silicide conductor. A layer of silicon is deposited under varying deposition conditions to attain sub-layering, while simultaneously reducing the doping concentration from the bottom portion to the top portion. A silicide layer is then formed on this multi-layered silicon, typically by depositing a refractory metal and reacting it with the silicon. The multi-layered silicon is typically polysilicon as deposited, but may include one or more amorphous silicon sub-layers. The sub-layering produces interfaces, which provides for stress accommodation. In addition, the sub-layers may optionally have differing grain sizes or textures.

DETAILED DESCRIPTION

Figure 1:
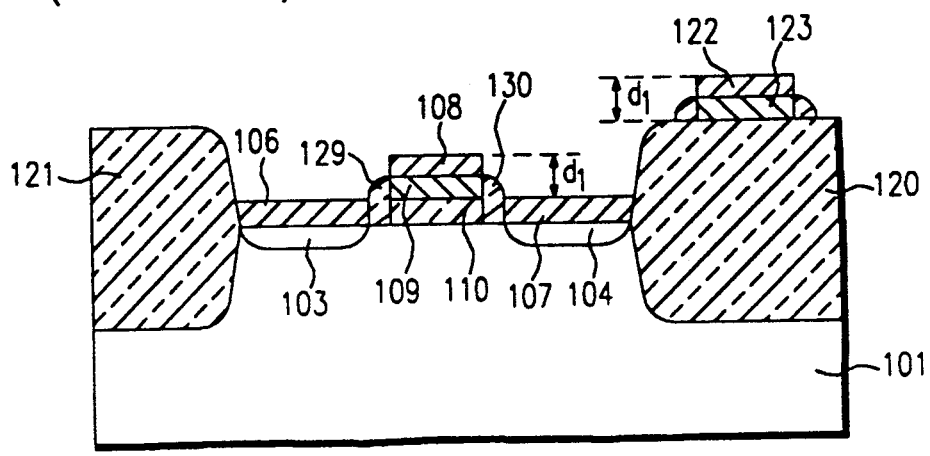
FIG. 1 shows a cross-section of a typical integrated circuit portion comprising the polycide structure.
Figure 2:
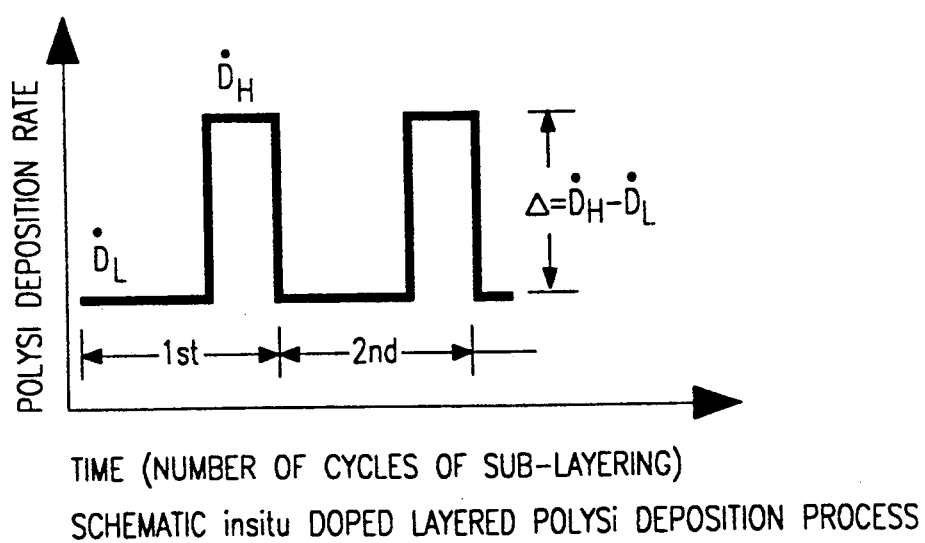
FIG. 2 shows the periodic change in polysilicon deposition rate as a function of time.

The present detailed description relates to an improved method of forming a semiconductor device comprising a doped polysilicon/silicide layered conductor. Referring to FIG. 2, the rate of depositing the polysilicon conductor layer is varied as a function of time. In the illustrative case, two periodic cycles are shown, producing four sub-layers of deposited polysilicon. However, the number of cycles, and hence number of sub-layers, may be any desired number. The deposition sequence typically begins with a low deposition rate ($\dot{D}_L$), followed by a high deposition rate ($\dot{D}_H$), which comprises the first cycle. The sequence continues with additional cycles. Although the low deposition rate portion of each cycle are shown as the same in FIG. 2, these values may in fact change from cycle to cycle. Similarly, the high deposition rate portion may change from cycle to cycle. The deposition rate differences are typically produced by changing either the pressure or the gas flow rates, or both, during the deposition process. Other factors, including the temperature, may also be used to change the deposition rate if desired. The result of these changes during deposition is sub-layering of the deposited silicon, also referred to as "multi-layering" herein, wherein interfaces are produced between adjacent sub-layers. This sub-layering provides for stress accommodation within the polysilicon layer, allowing for improved silicide formation. Other beneficial effects may accrue, including reduced channelling of ion-implanted species through the polysilicon layer.

In addition to providing cyclical changes in the deposition rate, the present invention provides for reducing the dopant concentration of the deposited polysilicon for subsequently-deposited sub-layers. That is, referring to FIG. 3, the dopant concentration for the first sub-layer is highest, with the concentration decreasing for sub-layers 2, 3, and 4. We have found that this desirably provides for improved interfacial properties, by providing the most lightly doped (or undoped) sub-layer in contact with the silicide layer that is formed on top of the deposited polysilicon. In addition, the relatively high doping level in the first-deposited (i.e., lower) sub-layers provides for adequate doping to produce low resistivity in the final polysilicon layer. In general, the dopant concentration may decrease in a variety of monotonic sequences. For example, the concentration may remain the same for two (or more) adjacent sub-layers, and decrease thereafter. Furthermore, one or more of the topmost sub-layers may be formed entirely without dopant (i.e., undoped). Various high-temperature processing steps subsequent to the deposition of the doped polysilicon sub-layers (including the step of forming the silicide layer) may serve to re-distribute the dopant in the polysilicon layer, so that the final distribution is typically more uniform than that as deposited.

Figure 4:
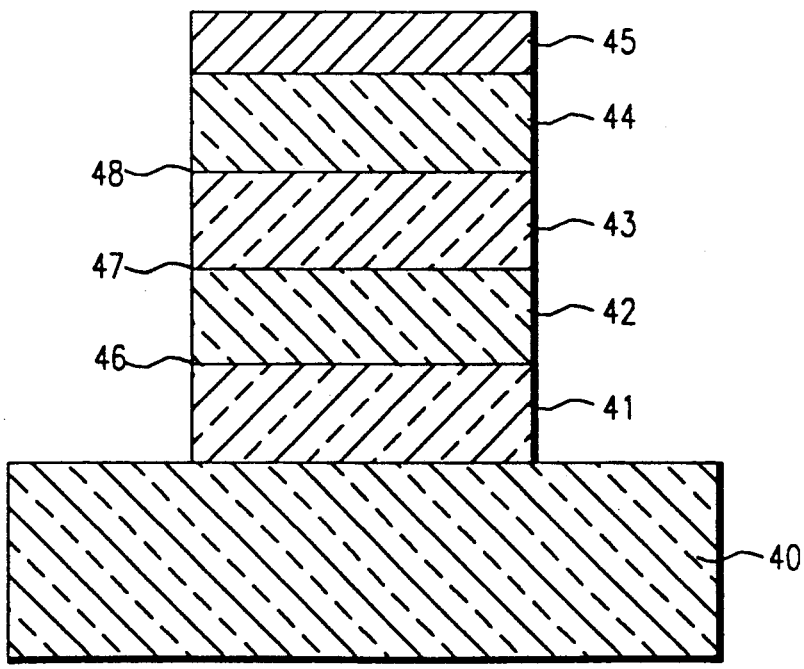
FIG. 4 shows the polysilicon sub-layers and a silicide layer thereon.

As a final step, the silicide layer is formed on the deposited polysilicon layer. The may be accomplished by depositing a refractory metal (e.g., titanium or tungsten) directly onto the deposited polysilicon, and reacting it with the underlying polysilicon by heating to an elevated temperature to form the silicide. In that case, the top portion of the deposited polysilicon is consumed to form the silicide. Alternately, it is known to co-deposit a metal (e.g., tantalum, tungsten, or molybdenum) and polysilicon to produce the silicide layer. In that case, there may be no substantial consumption of the previously-deposited polysilicon. The resulting structure is shown diagrammatically in FIG. 4, wherein the first through fourth polysilicon sub-layers (41 . . . 44) are shown as deposited on the silicon dioxide layer 40. The silicide layer 45 is shown on top. Note that the interfaces are indicated by the lines 46, 47 and 48 between adjacent sub-layers. These interfaces form the boundary between sub-layers having either differing defect states, textures, or phase transitions. For example, adjacent sub-layers may have different degrees of crystallinity.

The above process will be more fully illustrated by means of the following Example.

EXAMPLE

Figure 3:
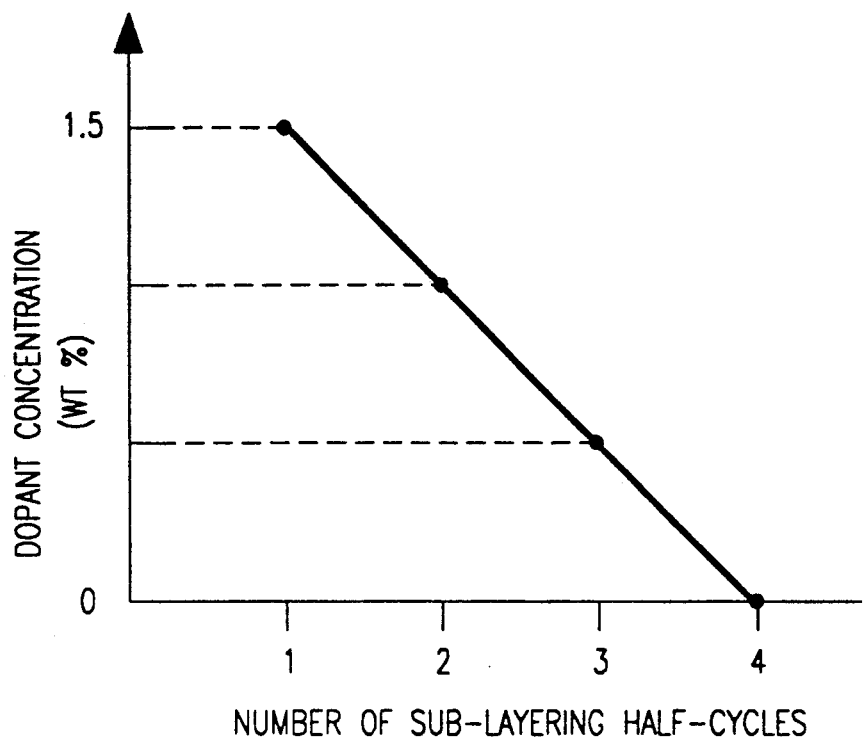
FIG. 3 shows the reduction in dopant concentration of the polysilicon sub-layers.

Polysilicon was deposited by the low pressure chemical vapor deposition (LPCVD) technique onto a silicon dioxide gate dielectric layer on a silicon substrate. The deposition was accomplished by pyrolysis of silane ($SiH_4$) at a temperature of 620 degrees C. The deposition rate was varied from a low rate ($\dot{D}_L$) of 10 angstroms per minute to a high rate ($\dot{D}_H$) of 100 angstroms per minute for a total of 4 half-cycles, as shown in FIG. 2. The deposition rate differences ($\Delta$) were obtained by varying the pressure from 0.4 to 1.3 torr in the CVD reactor. A total polysilicon thickness of about 4500 angstroms (450 nanometers) was achieved. During deposition, the polysilicon was doped in situ by adding $PH_3$ gas diluted by nitrogen carrier gas to the silane atmosphere. The dopant concentration was decreased as shown in FIG. 3, being in the range of 0.8 to 0.9 weight percent for the first (bottom) sub-layer, and decreasing to the range of 0.3 to 0 weight percent for the last (top) sub-layer. Next, a layer of titanium 700 to 1000 angstroms thick was deposited by sputtering. The silicide was then formed by rapid thermal annealing in a nitrogen atmosphere in two heating steps. In the first heating step, the structure was heated to 600 to 640 degrees C. for a period of 1 to 2 minutes. Then, the unreacted titanium was removed by etching. In the second heating step, the structure was heated to 800 to 900 degrees C. for 10 to 60 seconds. This achieved a low-resistivity disilicide phase approximately 800 to 1200 angstroms thick on top of a doped polysilicon layer approximately 4000 angstroms thick.

The integrity between the polysilicon and silicide layers was found to be very good over a number of samples, and the sheet resistance of the overall polycide structure remained at a low value of about 0 to 5 ohms per square, due mostly to the silicide layer. In addition, test on a number of samples showed that the threshold voltage of field effect transistors having this polycide gate structure were more constant as compared to those made by conventional techniques. This improved consistency is apparently due either to reduced spiking of the metal silicide into the polysilicon layer, or else the reduced stress within the polysilicon layer, which affects the work function associated with the polysilicon layer. To compare the stress characteristics of polysilicon layers made by the inventive technique with those made by the conventional technique (and with single-crystal silicon), X-ray diffraction studies were conducted. The peak profiles of the Si (220) and Si (311) lines were determined. It was found that the inventive structures had peaks that were intermediate between those for conventional polysilicon and single crystal silicon. Hence, the stress in the inventive structures was much less than that of conventional polysilicon.

The titanium silicide/polysilicon interfacial characteristics were also studied for structures made by the inventive technique. These were compared to conventional titanium silicide/polysilicon structures, where the polysilicon was deposited in one continuous layer (i.e., no sub-layers due to variations in the deposition conditions). The thicknesses of both types of structures were similar, being about 3800 angstroms (380 nanometers). In a first comparison, a spreading resistance profile of each type of structure was conducted. In a second comparison, a SIMS (Surface Imaging Mass Spectroscopy) concentration depth profiling of each type of structure was conducted. These techniques both gave an indication of the effective carrier concentration (of the phosphorus dopant) in the polysilicon as a function of depth in the structure. The comparisons showed that a more shallow and more uniform titanium silicide layer, having a much sharper silicide/polysilicon interface, was obtained by use of the inventive technique. In addition, the planarity of the structures made by the inventive technique was significantly improved as compared to those made by the conventional technique. This appears to be due to the reduction in stress resulting from the multiple sub-layers.

The foregoing results show that the polysilicon/silicide gate stack height can be reduced substantially, without losing silicide integrity, by using the inventive technique. In particular, the present technique is especially advantageous for allowing the polysilicon/silicide stack height to be reduced below 3500 angstroms (350 nanometers), which is below that obtainable by prior art techniques. The present technique even allows for stack heights of less than 2500 angstroms (250 nanometers), which may be desirable for sub-half micrometer devices. However, the inventive technique is also advantageous even at relatively large stack heights, as for reducing the above-noted channeling effect.

Although the deposited silicon of the present invention has been described above as "polysilicon", some or all of the sub-layers may be deposited in the form of amorphous silicon. The use of amorphous silicon has the otherwise known advantage of producing a relatively smooth surface, as compared to polysilicon. However, heating steps that are part of the normal IC production sequence subsequent to the deposition step will cause the nucleation and growth of silicon grains, thereby converting the amorphous silicon into polysilicon. Alternately or additionally, some of the deposited layers may be polysilicon that has different silicon grain sizes as compared to other layers. For example, it may be desirable to deposit smaller-grained polysilicon for the later-deposited (upper) sub-layers, as compared to the initially-deposited (lower) sub-layers, in order to obtain a smoother top surface for improved silicide formation. As is known in the art, the size of the silicon grains generally decreases at lower deposition temperature, and the deposited silicon becomes amorphous a deposition temperatures below about 570 degrees Centigrade.

We claim:

1. A method of making a semiconductor device comprising the steps of:

(1) forming a gate dielectric layer on a semiconductor body; and (2) forming a gate electrode on said gate dielectric layer, wherein said gate electrode comprises a doped silicon layer and an overlying metal silicide layer;

characterized in that said step of forming a gate electrode includes the steps of:

(3) depositing a first silicon sub-layer at a first deposition rate, and depositing a second silicon sub-layer at a second deposition rate that is different than said first rate;

(4) including a dopant in said first sub-layer at a first concentration; and including a dopant in said second sub-layer at a second concentration that is less than said first concentration, and (5) forming said metal silicide layer.

2. The method of claim 1 wherein said second deposition rate is greater than said first deposition rate.

3. The method of claim 1 further comprising the step of depositing a third silicon sub-layer at a third deposition rate that is different than said second deposition rate, prior to forming said metal silicide layer.

4. The method of claim 3 further comprising the step of including a dopant in said third sub-layer at a third concentration that is less than said second concentration.

5. The method of claim 3 wherein said third deposition rate is less than said second deposition rate.

6. The method of claim 3 further comprising the step of depositing a fourth silicon sub-layer at a fourth deposition rate that is different than said third deposition rate, prior to forming said metal silicide layer.

7. The method of claim 6 further comprising the step of including a dopant in said fourth sub-layer at a fourth concentration that is less than said third concentration.

8. The method of claim 6 wherein said fourth deposition rate is greater than said third deposition rate.

9. The method of claim 1 wherein said first silicon sub-layer is the bottom sub-layer that is deposited directly onto said gate dielectric.

10. The method of claim 1 wherein said metal silicide is selected from the group consisting of titanium silicide, tantalum silicide, tungsten silicide, molybdenum silicide, and cobalt silicide.

11. The method of claim 1 wherein said metal silicide is titanium silicide.

12. The method of claim 1 wherein at least one sub-layer is deposited in the form of polysilicon.

13. The method of claim 1 wherein at least one sub-layer is deposited in the form of amorphous silicon.

14. The method of claim 1 wherein the stack height of said doped silicon layer and metal silicide layer is less than 350 nanometers.

15. The method of claim 1 wherein the stack height of said doped silicon layer and metal silicide layer is less than 250 nanometers.

* * * * *